United States Patent [19]

Bains

[11] Patent Number: 5,606,286

[45] Date of Patent: Feb. 25, 1997

[54] PREDISTORTION LINEARIZATION

[76] Inventor: Devendar S. Bains, 78 Wescott Rd., Neshanic Station, N.J. 08853

[21] Appl. No.: 508,163

[22] Filed: Jul. 27, 1995

[51] Int. Cl.$^6$ ....................................................... H03F 1/26
[52] U.S. Cl. .............................................................. 330/149
[58] Field of Search ............................ 330/124 R, 129, 330/149, 151, 284

[56] References Cited

U.S. PATENT DOCUMENTS

| | | | |
|---|---|---|---|
| 5,117,197 | 5/1992 | Hsu et al. | 330/151 X |
| 5,363,056 | 11/1994 | Blauvelt | 330/151 X |
| 5,444,418 | 8/1995 | Mitzlaff | 330/151 X |

*Primary Examiner*—Steven Mottola
*Attorney, Agent, or Firm*—Thomas L. Adams, Esq.

[57] ABSTRACT

A linearizer has a dividing system for dividing a radio frequency signal into a first, second and third part. First and second transfer devices, each driven by the dividing system, can separately amplify the first and the second part of the signal. The first transfer device produces a higher distortion than the second with a distortion-producing, conditioning device. The second transfer device has, with respect to undistorted output components, a transfer characteristic whose output phase and amplitude substantially tracks that of the conditioning device during variations in amplitude. The first transfer device also has a retarding device serially coupled with the conditioning device for retarding signals handled at the conditioning device to produce approximately a 180 degree phase shift between the outputs of the first and the second transfer devices. A third transfer device is driven by the third part of the radio frequency signal from the dividing system. A first Wilkinson combiner coupled to the outputs of the first and the second transfer devices can produce a distortion signal corresponding to a combination of signals on the outputs of the first and the second transfer devices. A second Wilkinson combiner can combine the distortion signal with the signal on the output of the third transfer device to provide a predistortion signal.

43 Claims, 3 Drawing Sheets

PREDISTORTION LINEARIZATION

BACKGROUND OF THE INVENTION

1. Field of the Invention

The present invention relates to predistorting signals in order to compensate for non-linearities, and in particular to linearization for small signal receiving devices or high power transmitting devices, operating at radio frequencies.

2. Description of Related Art

Communications systems handling a single carrier, usually employ high efficiency and low linearity (class C) amplifiers. Multi-carrier systems, however, require highly linear (class A) amplifiers at the expense of efficiency. An ideal amplifier would exhibit both perfect linearity and high efficiency.

Intermodulation distortion (IMD) products are produced by non-linearities in amplifiers handling radio frequency signals, such as the multiple carrier signals found in cellular telephone systems or in various other types of personal communications systems (PCS). Distortion can be caused by amplitude compression or phase shifts that occur for relatively large amplitude signals. The resulting spurious signals are added to the spectrum of the information bearing signals and thus degrade the quality of associated communications.

While the phenomena are fairly complex, the transfer function of an amplifier exhibiting non-linearities can be approximated by a Taylor series, that is, a polynomial with terms of the form $a_n x^n$. The first order effect (ax) is the desired linear function. Distortion is caused by the second order term (square term), the third order term (cubic term), and so forth.

For many high frequency systems, the even order terms produce harmonics that are out of the working bandwidth of the system and therefore rejected. For example, in a two carrier system with carrier frequencies $f_1$ and $f_2$, the second order harmonic frequencies are $2f_1$ and $2f_2$. These harmonic terms are typically far removed from the spectrum of the two carriers and can easily be removed by filtering.

For third order effects, the harmonic components of distortion include frequencies at $2f_1-f_2$, and $2f_2-f_1$, which are typically near the spectrum of the main carrier components. Other third order components are far outside the working spectrum and can be easily filtered. Typically, only odd order (third, fifth, seventh, etc.) intermodulation products are a concern.

Conventional amplifiers when driven to only modest power output operation levels well defined regions where output power of the odd harmonics bear a simple relationship to the power input. For example, the third order components, measured as a ratio to power input in dB, will increase at a rate three times the rate of increase of input power. Thus, a one dB increase in input power will cause a three dB increase in the third order distortion component $d_3$ (FIG. 5, also showing the overall transfer function G on a log-log scale of power input $P_i$ vs. power output $P_o$). At the same time the fifth order component will increase by five dB, the seventh order component seven dB, etc.

This orderly relationship between the change in the power of distortion components with input power breaks down for relatively high or relatively low power levels where the distortion curve flattens. The changes in distortion in this poorly defined region depend on device characteristics and other subtle phenomena making compensation difficult.

A linearizer may be used to reduce the effects of intermodulation distortion products. Am improvement is measured as an increased carrier to intermodulation power ratio (C/I). The two most common uses for linearizer networks are to improve the C/I performance of either small signal receiving amplifiers or high power transmitting devices, both of which are found in satellite communications systems. For small signal devices, linearization improves the overall dynamic range of the receiving system. Thus, the cost of a linearizing network is overcome by the significant C/I performance improvement. When a linearized amplifier is compared to a device, without linearization but with an equivalent performance, the savings can become substantial. The overall energy consumed by the linearizing network in receiving systems is significant but is not of concern due to the small power levels.

High power class A amplifiers are inefficient and can be very expensive. Benefits of linearization are realized as an improved IMD performance with less energy and cost being expended to attain a performance equivalent to that of a higher power and, consequently, more expensive device. The additional power dissipation of the linearizing network is normally a small fraction of the overall amplifier power consumption.

Effective power can be used as a measure of the relative merit of linearizing a device. A highly efficient device exhibits low power consumption and high output power for a given linearity. The overall "effective" efficiency is obtained by comparing the power consumption of a linearized amplifier to that of a standard amplifier of equivalent performance. If only third order IMD products are considered significant, then a 9 dB C/I improvement would equal the performance of a device more powerful by a factor of 3 dB. The general relation between equivalent power performance and improvement in C/I provided by a linearizer is indicated by the equivalent power performance (EPP), which equals ⅓ [C/I] (in dB). The "effective" efficiency factor is defined as 10 exp(EPP/10).

The previous example (9 dB improvement in C/I) translates into an increased "effective" efficiency of 2 times the existing (non-linearized) efficiency. The non-linearized efficiency is defined as the ratio of output power to input power ($P_o/P_i$). Maximum theoretical efficiency of a class A amplifier occurs at maximum power output (compression) and is equal to 50%. See J. Millman, "Microelectronics: Digital and Analog Circuits and Systems," McGraw-Hill Inc., New York, N.Y., pp. 666–667 (1979).

Several linearization approaches are available. These include feedback, feed forward, and predistortion. The first two are considered more complex and, consequently, more expensive than the third—predistortion. For feedback linearization in general, see E. Ballesteros, F. Perez and J. Perez, "Analysis and Design of Microwave Linearized Amplifiers Using Active Feedback," IEEE Trans. on Microwave Theory Tech., Vol. 36, No. 3, pp. 499–504; March 1988.

The second technique, feedforward linearization, involves extracting the actual distortion produced by an amplifier or other device. The extraction is performed by using the unamplified signal to cancel the undistorted signal component produced by the amplifier, leaving only distortion. This distortion is then boosted and used to cancel distortion in the amplified signal. In U.S. Pat. No. 5,304,945 two such stages of feedforward, distortion compensation are employed. See also U.S. Pat. Nos. 4,879,519 and 4,885,551. For a general discussion of feedforward linearization, see M. Sidel, "A Microwave Feed-Forward Experiment," Bell System Technical Journal, Vol. 50, pp. 2861–2879; September 1971.

These feedforward techniques may also employ a locally injected pilot signal used to facilitate feed back control of the distortion cancellation process. See for example, U.S. Pat. Nos. 4,580,105; 5,130,663; and 5,155,448.

With the third technique (predistortion) signals applied to the input of an amplifier are predistorted in such a way that the intentionally added distortion effectively cancels the distortion generated by the amplifier itself. For example in U.S. Pat. No. 4,588,958 a predistortion circuit has a linear and non-linear terminator connected through a directional coupler to the input of an amplifier to be linearized. The non-linear terminator can include diodes for generating distortion. In U.S. Pat. No. 4,882,547 a predistortion circuit of that type is automatically adjusted based upon a measurement of the ratio of the carrier to second harmonic.

Predistortion circuits have used an FET linearizer for generating predistortion for compensating an amplifier. Devices of this type essentially employ a single, forward signal path with the FET generating compensating distortion prior to driving the amplifier. See for example U.S. Pat. Nos. 5,038,113; 5,162,748; 5,191,338; and 5,138,275. In U.S. Pat. No. 4,564,816 a pair of FETs are both used to produce distortion in a predistortion circuit. See also U.S. Pat. No. 4,488,122 for generation of distortion using a ferrimagnetic material.

In U.S. Pat. No. 4,554,514, a predistortion circuit has an adjustable phase shifter and adjustable attenuator coupled to the input of a power amplifier. The output of that power amplifier is coupled in a digital feedback loop to adjust the phase and attenuation produced by the predistortion circuit.

In U.S. Pat. No. 4,772,855 a predistortion signal is produced by a circuit having adjustable phase and amplitude modulators. These two modulators are controlled by a circuit that senses the amplitude of the input to the modulators to feed forward a signal for controlling both modulators. This system effectively uses a feed forward circuit to produce a non-linear, predistortion signal.

U.S. Pat. No. 5,361,156 shows a predistortion circuit having a linear branch and a branch with a distortion generator. The branch with the distortion generator has adjustable amplitude and phase. The predistortion is produced to compensate for distortion occurring in an optical communications link. Another system having a linear and non-linear branch is shown in U.S. Pat. No. 5,304,944. Neither of these systems attempt to isolate the distortion for separate treatment. Instead, the distortion generator produces distortion that remains combined with the undistorted, carrier component. See also U.S. Pat. No. 5,396,190.

In U.S. Pat. No. 4,987,378 two signal samplers (dividers) cooperate with two signal combiners to establish two signal loops. One of the loops has a pair of branches: One branch has a variable phase adjustment and another branch has a distortion generator cascaded with circuits that adjust phase and amplitude. These branches produce through one of the signal combiners a signal that has only distortion, that is, the carrier signal is removed. This pure distortion signal is then recombined with an the original, undistorted signal using phase adjustment and amplitude adjustment to produce a predistortion signal.

A disadvantage with circuits of this type is the lack of tracking between different branches designed to produce the distortion signal without the carrier. For example, U.S. Pat. No. 4,987,378 mentions building the distortion generator branch either with anti-parallel diodes or an amplifier that is driven into compression. The other branch, used to cancel the carrier signal, has very different structure: an adjustable phase shifting circuit employing a hybrid coupler connected to varactor diodes to produce an adjustable phase shift. The difficulty with using a mixture of circuits of various types is the inability of the two branches to accurately track in phase and distortion as the amplitude of the drive signals through the two branches varies.

Moreover, because of the overall circuit topology, the linearizer circuit U.S. Pat. No. 4,987,378 has multiple phase adjustments. In fact, each disclosed embodiment is shown with three or four independent adjustments. This large number of adjustments clearly complicates the use of the linearizer in practical embodiments.

For other references concerning predistortion and other techniques, see:

A. M. Killia, "Linearizers for Microwave Power Amplifiers in Communications Satellites," ANT Nachrichtentechnik (1988).

A. Katz, R. Sudarsanam and D. Aubert, "A Reflective Diode Linearizer for Spacecraft Applications," IEEE Trans. on Microwave Theory and Tech., pp. 661–664 (June 1985).

M. Kumar, J. C. Wartenby and H. J. Wolkstein, "Predistortion Linearizer Using GaAs Dual-Gate MOSFET for TWTA and SSPA Used in Satellite Transponders," IEEE Trans. on Microwave Theory and Tech., Vol. MTT-13, No. 12, pp. 1479–1488 (December 1985).

D. Cahana, J. R. Potukuchi, R. G. Marshalek and D. K. Paul, "Linearized Transponder Technology for Satellite Communications Part 1: Linearized Circuit Development and Experimental Characterization," COMSAT Technical Review, Vol. 15, No. 2A. pp. 277–308 (Fall 1985).

D. Pham, G. Lindgren and J. Steck, "A C-Band TWT Linearizer for Satellite Up-Link Transmitters," IEEE MTT-S International Microwave Symposium (May 1988).

G. Satoh, "MIC Linearizer for Satellite Communications," IEEE MTT-S International Microwave Symposium (May 1988).

T. Nojima, "Linearizers for Microwave Power Amplifiers," IEEE MTT-S International Microwave Symposium (May 1988).

T. C. Edward, "Foundations for Microstrip Circuit Design," John Wiley and Sons, New York, N.Y., pp. 57–59 (1985).

E. C. Jordan, "Reference Data for Engineers," Howard W. Sams and Co., Inc., Indianapolis, Ind., pp. 6.2–6.4 (1985).

H. Howe, Jr., "Stripline Circuit Design," Artech House Inc., Dedham Mass., pp. 261–266 (1985).

G. L. Matthaei, L. Young and E. M. T. Jones, "Microwave Filters, Impedance-Matching Networks, and Coupling Structures," Artech House Inc., Dedham Mass., pp. 755–809 (1980).

H. Howe, Jr., "Stripline Circuit Design," Artech House Inc., Dedham Mass., pp. 111–180 (1985).

J. P. Shelton, Jr., "Impedances of Offset Parallel-Coupled Strip Transmission Lines," IEEE Trans. on Microwave Theory and Tech., Vol. MTT-14, No. 1, pp. 715 (January 1966).

V. F. Fusco, "Microwave Circuits, Analysis and Computer-Aided Design," Prentice-Hall International (UK) Ltd., pp. 316–322 (1987).

H. Howe, Jr., "Stripline Circuit Design," Artech House Inc., Dedham Mass., pp. 77–110 (1985).

An object of the present invention is to provide an improved linearizer combining feedforward techniques with predistortion.

SUMMARY OF THE INVENTION

In accordance with the illustrative embodiments demonstrating features and advantages of the present invention, there is provided a linearizer for predistorting a radio frequency signal from a source, before subsequent processing. The linearizer has a dividing means adapted to be coupled to the source for dividing the radio frequency signal into a first, second and third part. The linearizer also has a first and a second transfer means coupled to the dividing means for receiving the first and the second part, respectively, of the radio frequency signal. The first and the second transfer means each has an output. The first transfer means has a conditioning device for conveying signals with distortion. A third transfer means of the linearizer has an output and has an input coupled to the dividing means for separately receiving the third part of the radio frequency signal. Also included is a combining means coupled to the outputs of the first, the second and the third transfer means for producing a predistortion signal corresponding to a combination of signals on the outputs of the first, the second and the third transfer means. The second transfer means has, with respect to undistorted output components reaching the combining means, a transfer characteristic whose output phase and amplitude substantially tracks that of the conditioning device during variations in amplitude. The linearizer also has a retarding means coupled with the combining means for retarding signals handled at the combining means to produce approximately a 180 degree phase shift between the outputs of the first and the second transfer means.

According to another aspect of the invention a linearizer employs the previously mentioned dividing means, combining means and third transfer means. This linearizer has a first transfer means and a second transfer means each having an output and each being coupled to the dividing means for separately amplifying the first and the second part of the radio frequency signal. The first transfer means has higher distortion than the first transfer means.

Also according to still another aspect of the invention, a linearizer has the previously mentioned dividing means, third transfer means, and combining means. Also included is a first and a second transfer means coupled to the dividing means for receiving the first and the second part, respectively, of the radio frequency signal. The first and the second transfer means each has an output. The first transfer means includes a conditioning device for conveying signals with distortion, and a retarding means. The retarding means is serially coupled with the conditioning device for retarding signals handled at the conditioning device to produce approximately a 180 degree phase shift.

Also according to yet another aspect of the invention, a linearizer has the previously mentioned dividing means, and third transfer means. This linearizer a first and a second transfer means each having an output and each having an input coupled to the dividing means for separately receiving the first and the second part of the radio frequency signal. Also included is a first Wilkinson combiner coupled to the outputs of the first and the second transfer means for producing a distortion signal corresponding to a combination of signals on the outputs of the first and the second transfer means. The linearizer also has a second Wilkinson combiner coupled to the first Wilkinson combiner and the output of the third transfer means for combining the distortion signal with the signal on the output of the third transfer means to provide a predistortion signal.

According to a related method of the present invention, a radio frequency signal can be predistorted with a pair of devices before application to a power amplifier. The method includes the steps of applying the radio frequency signal to the pair of devices with a first one of the devices operated to produce more distortion than the second one of the devices. Another step is producing a distortion signal by combining the output of the pair of devices to substantially cancel the radio frequency signal except for distortion created by the first one of the devices. the method also includes the step of producing a predistortion signal by recombining the distortion signal with a replica of the radio frequency signal. Also included is the step of driving the power amplifier with the predistortion signal sized to bring the power amplifier to its rated power output. the method also includes the step of adjusting the relative phase and relative amplitude between the distortion signal and the replica of the radio frequency signal in a direction to minimize the measured magnitude of third order distortion components produced by the power amplifier.

By employing apparatus and methods of the foregoing type, an improved predistortion circuit can be achieved that compensates for non-linearities in a device, such as a radio frequency, power amplifier. In a preferred embodiment, a pair of small signal amplifiers are both driven from a divider with an undistorted radio frequency signal. One amplifier operates in a substantially linear mode, while the other has a certain amount of distortion. The distorted signal is inverted by a 180° delay line and combined with the undistorted signal, in a preferred Wilkinson combiner. The resulting output is primarily the odd order harmonics of the distortion, since the carrier signal was cancelled in the Wilkinson combiner. This signal is a substantial replica of the distortion that would be produced in a power amplifier, but with a reversed phase.

This distortion signal is then combined with the original, undistorted, radio frequency signal in another Wilkinson combiner to produce a predistortion signal. This predistortion signal has the original undistorted signal, but now supplemented with inverted distortion components. This predistortion signal can be applied to a conventional power amplifier or other device, which will then produce a substantial linear output with substantially reduced distortion.

Preferably, the phase and amplitude of the distortion signals are adjusted before being combined with the original, undistorted version of the radio frequency signal, which is delayed to match group delays through the other, parallel circuit paths.

BRIEF DESCRIPTION OF THE DRAWINGS

The above brief description, as well as other objects, features and advantages of the present invention will be more fully appreciated by reference to the following detailed description of presently preferred, but nonetheless illustrative embodiments in accordance with the present invention, when taken in conjunction with the accompanying drawings, wherein.

DETAILED DESCRIPTION OF THE PREFERRED EMBODIMENTS

Figure 4:
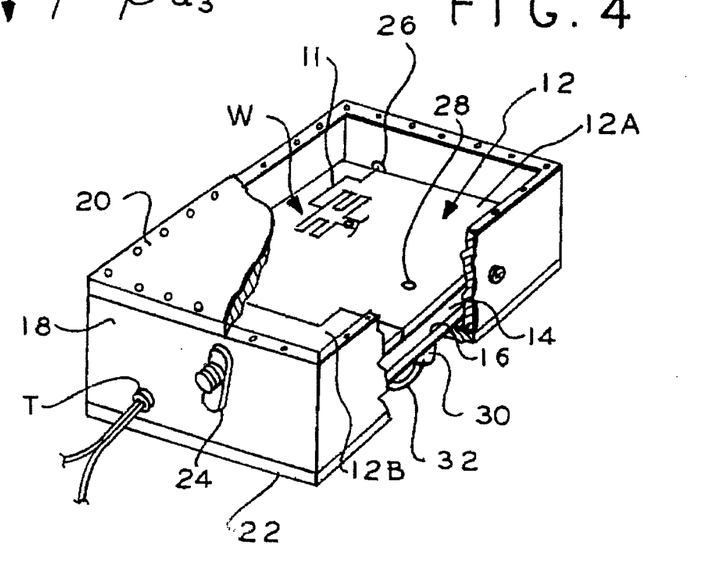
FIG. 4 is an axonometric view of the physical arrangement of the linearizer of FIG. 1.

The linearizer circuit of FIG. 4 employs a radio frequency, printed circuit board 12. A number of microstrip lines 11 are etched onto the outer surface of board 12, which is preferably FR4 board. The dimensions of the strip lines, the quality of the printed circuit board and the like can be designed in accordance with the expected frequencies and power range. The printed circuit board 12 is segmented into a preamplifier circuit board 12B and predistortion circuit board 12A, as described further hereinafter. The preferred circuit board was about 2.5 inches by (6.4 cm) by 3.5 inches (9 cm) although other dimensions are possible.

The board 12 was mounted on an aluminium plate about 1/8 inch thick (0.3 cm) and having a similar rectangular outline. Mounted on the opposite side of aluminum support plate 14 is a low frequency printed circuit board 16 for providing bias and supply voltages. Aluminum support plate 14, sandwiched between printed circuit boards 12 and 16, is screwed in the middle of a four sided aluminum frame 18. Aluminum covers 20 and 22 are screwed in place over frame 18.

Primary supply voltage is applied to the device of FIG. 4 through terminals T. Input and output radio frequency signals are applied through coaxial connectors, such as connector 24, which is screwed to the side of frame 18. Strip line 11 is shown connecting at junction 26 to the center pin of a coaxial connector similar to illustrated connector 24.

A coaxial connector 30 mounted on board 16 connects through hole 28 to circuit board 12. Connector 30 connects to a semi-rigid coaxial cable 32 acting as a delay line. The other end of cable 32 connects to another connector (not shown) on the surface of low frequency printed circuit board 16.

Figure 1:
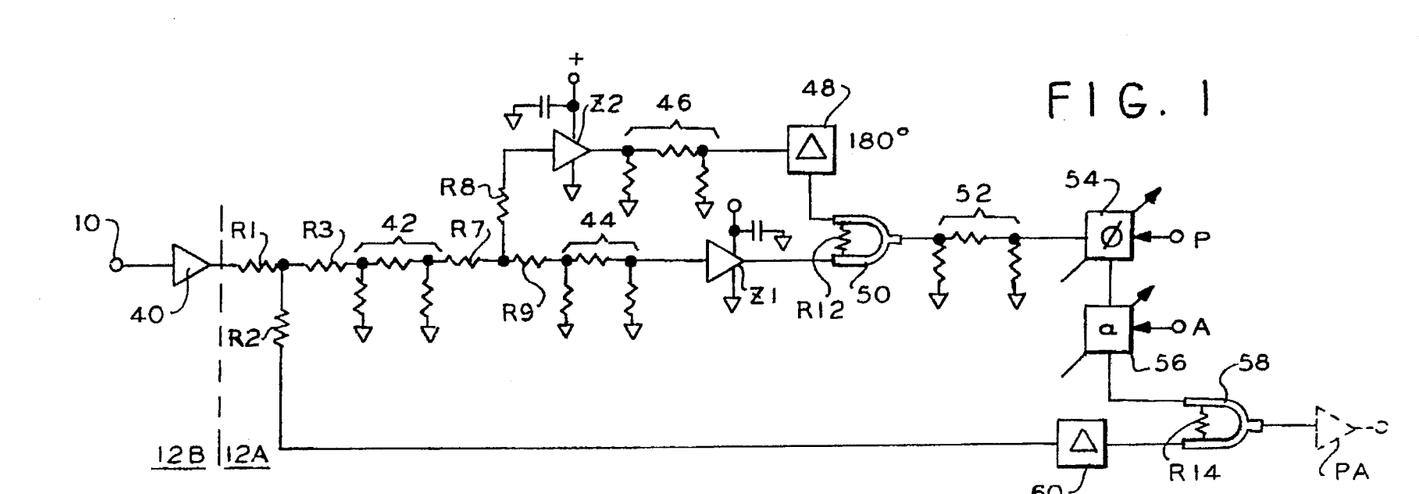
FIG. 1 is a schematic block diagram of a linearizer in accordance with the principles of the present invention.

Referring to FIG. 1, a linearizer is illustrated for predistorting a radio frequency signal from a source at terminal 10. The linearizer predistorts the signal before applying it to a power amplifier PA (shown herein in phantom since amplifier PA is not itself a part of the linearizer circuit). The linearizer illustrated in FIG. 1 is designed to operate in the ultra high frequency range, for example 859 MHz, although the principles disclosed herein can apply equally to lower or higher frequencies.

The previously mentioned printed circuit board (board 12 of FIG. 4) is schematically illustrated with preamplifier 40 mounted on circuit board 12B (FIG. 4) with the balance of the linearizer components mounted on board 12A. Radio frequency signal source 10 is shown connected to the input terminal of highly linear preamplifier 40. Amplifier 40 is biased to work at a highly linear region using only a small portion of its potential dynamic range to ensure high linearity.

The output of preamplifier 40 is connected to a first divider means shown in the form of a resistor R1 connected between the output of preamplifier 40 and the junction of resistors R2 and R3 (this first divider means together with a subsequently described second divider means are collectively referred to as a dividing means). Resistor R3 is serially connected with attenuator 42 to deliver to it a signal referred to as an intermediate part. Attenuator 42 is a pi-attenuator shown with a series resistor straddled by a pair of shunting resistors.

Attenuator 42 feeds a serial resistor R7, serially connected to the junction of dividing resistors R8 and R9 to form a second divider means. Dividing resistors R8 and R9 convey signals herein referred to as a first part and a second part, respectively.

Resistor R8 feeds a first transfer means, shown herein as the cascaded combination of first amplifier Z2 and first attenuator 46. Amplifier Z2 (also referred to as a conditioning device) was in a constructed embodiment a type VNA-25 high frequency, monolithic amplifier, manufactured by Mini-Circuits of Brooklyn, N.Y. This amplifier had a typical gain of 17 dB and a typical maximum output power of 18.5 dBm when used with a 5 volt power supply. It will be appreciated that other types of amplifiers can be used instead. For example, a discrete high frequency transistor may be used. Also certain embodiments offering different features may operate without an active circuit having gain.

The output of amplifier Z2 is coupled through first attenuator 46 to a delay device, which in the preferred embodiment was a serpentine (wandering) strip line 48. Device 48 is also referred to as a retarding means. Delay device 48 is designed to provide a delay equivalent to a 180 degree phase shift. Thus delay device 48 acts as an inverter.

Resistor R9 feeds a second attenuator 44, shown as a pi-attenuator having a series resistor straddled by a pair of shunt resistors. Attenuator 44 connects to the input of a second amplifier, preferably a device identical to device Z1, for reasons described hereinafter. This second amplifier Z1 is referred to as a matching device. Amplifier Z1 together with attenuator 44 is also referred to as a second transfer means.

The balance of the predistortion circuit of FIG. 1 is referred to herein as a combining means. A first combination means of the combining means is illustrated as a first Wilkinson combiner 50. The Wilkinson combiner is a known configuration having two strip line branches that are each an integer number of half wavelengths long and join at an output junction with substantially no reflection and substantially no crosstalk between the two inputs. In the constructed embodiment, the branches of the Wilkinson combiner were in the form of zig-zag traces similar to that illustrated in FIG. 4 as device W. The inputs of the two branches of Wilkinson combiner 50 are connected together by a terminating resistor R12 sized to prevent reflections. One input of Wilkinson combiner 50 connects to the output of amplifier Z1 and the other input to the output of delay device 48.

The output of combiner 50 (referred to as a distortion signal) is conveyed through optional pi-attenuator 52 to the input of a phase means 54 having a structure that will be described presently. Phase means 54 produces a phase shift that is adjustable in accordance with an adjustable DC potential applied through terminal P.

The output of phase means 54 connects to the input of an amplitude means 56. As described hereinafter, amplitude means 56 is preferably a gain adjustable amplifier. The gain of this amplifier can be adjusted by an adjustable voltage applied to amplifier 56 through terminal A. The output of gain adjustable amplifier 56 is applied to one input of a second combination means, namely second Wilkinson combiner 58. The other input of combiner 58 connects to the output of a delay line 60 whose input connects to the output end of resistor R2. Delay line 60 is also referred to as a third transfer means, whose input signal is referred to as a third part.

The first, second and third transfer means are disclosed herein as employing such elements as amplifiers and delay lines. It will be appreciated however that in some embodiments where the required amount of delay, phase shift or gain is different, one or more of these transfer means may be a simple connection producing little or no change in amplitude or phase.

Second Wilkinson combiner 58 has a terminating resistor R14 connected across its inputs and has a structure similar to combiner 50. The output of Wilkinson combiner 58 is referred to as a predistortion signal and is shown driving power amplifier PA.

Figure 2:
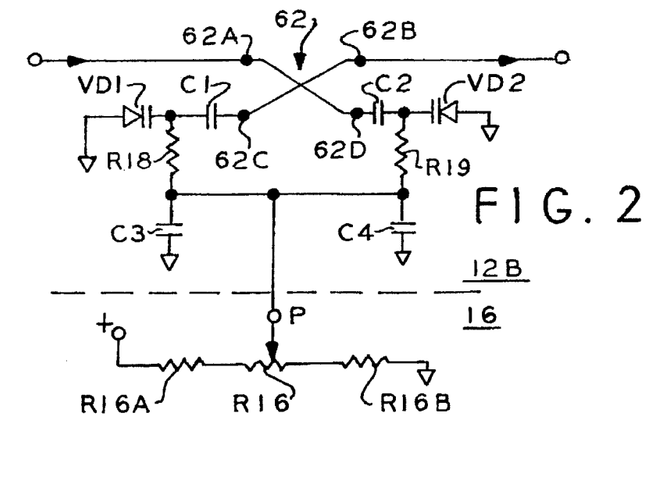
FIG. 2 is a more detailed schematic diagram of one of the blocks of the linearizer of FIG. 1.

Referring to FIG. 2, the previously mentioned phase means (means 54 of FIG. 1) is illustrated in further detail and employing a hybrid coupler 62. In this embodiment, coupler 62 is a power splitter/combiner type LRPQ-980, manufactured Mini-Circuits of Brooklyn, N.Y., although other types of couplers can be used instead. Coupler 62 is shown with four ports: input port 62A, output port 62B, and device ports 62C and 62D. The device ports 62C and 62D are effectively connected to pure capacitive reactance, thereby providing total reflection. Accordingly, a phase shift will exist from input 62A to output 62B in accordance with the magnitude of the capacitive reactance at device terminals 62C and 62D. The reactance at device terminal 62C is formed by capacitor C1 connected serially to the cathode of varactor diode VD1, whose anode is grounded. Similarly, the device terminal 62D is connected through serial capacitor C2 to the cathode of varactor diode VD2, whose anode is grounded. The variable devices connected to terminals 62C and 62D are referred to as variable impedance devices.

In a known fashion, diodes VD1 and VD2 are reverse biased by a voltage that can vary to vary the effective capacitance of the diodes. Specifically, positive, reverse bias potential is provided through the wiper of potentiometer R16 through previously mentioned terminal P to the junction of resistors R18 and R19, whose other terminals connect to the cathodes of diodes VD1 and VD2, respectively. The resistors R18 and R19 are connected closely to the device terminals 62C and 62D. To avoid unintended impedance effects through resistors R8 and R19, they have separate, adjacent capacitors C3 and C4 for shunting high frequency components to ground.

All components of FIG. 2 are mounted on previously mentioned, printed circuit board 12B, except for potentiometer R16 and its feed resistors R16A and R16B.

Figure 3:
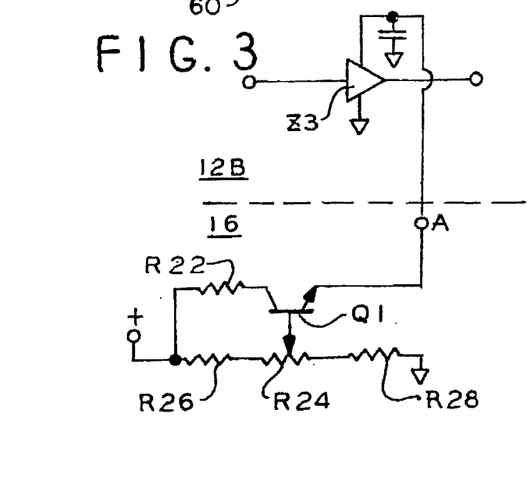
FIG. 3 is a more detailed schematic diagram of the amplitude adjusting block shown in the linearizer of FIG. 1.

Referring to FIG. 3, the previously mentioned amplitude means (means 56 of FIG. 1) is shown herein employing gain adjustable amplifier Z3. Amplifier Z3 may be identical to the previously mentioned, monolithic amplifiers (amplifiers Z1 and Z2 of FIG. 1). Supply voltage is applied to amplifier Z3 through previously mentioned terminal A. The dotted line indicates that amplifier Z3 is mounted on previously mentioned printed circuit board 12B while the power supply components are mounted on the low frequency circuit board 16.

The gain of amplifier Z3 can be adjusted by changing the supply voltage with the circuit shown in FIG. 3 as mounted on circuit board 16, also referred to herein as a bias means. The bias means has an output at the emitter of NPN transistor Q1, whose collector connects through resistor R22 to positive potential. A potentiometer R24 connects through resistor R26 to positive potential and through resistor R28 to ground. The wiper of potentiometer R24 connects to the base of transistor Q1. By adjusting the potential on the wiper of potentiometer R24, a low impedance output voltage is provided on the emitter of transistor Q1, which acts as an emitter follower.

Figure 5:
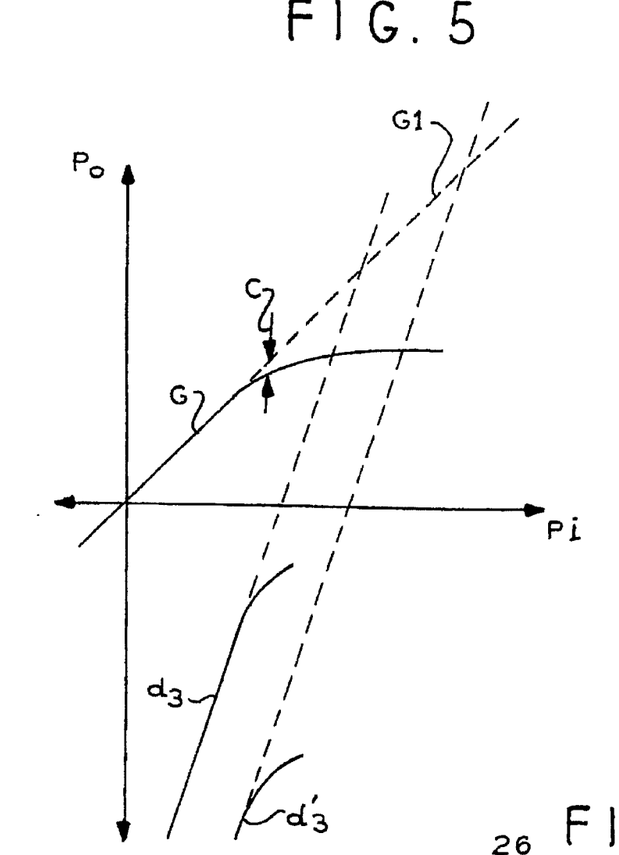
FIG. 5 is a chart showing the relationship among main and harmonic components in linearizers.

FIG. 5 shows the gain characteristic G of amplifier PA with power input Pi as the abscissa and power output Po as the ordinate. In normal operations, the amplifier is kept in a fairly linear region. The amplifier could operate with moderate distortion up to point C, where the power output is 1 dB down from the ideal non-compressed curve shown as a dotted line G1. Point C is referred to as the 1 dB compression point. However, to ensure good linearity, the power amplifier PA is normally operated with a maximum rated power output that is 3 dB less than the 1 dB compression point C. For some power amplifiers, the rated power output is backed off 6 dB from the 1 dB compression point.

The drive applied at terminal 10 of FIG. 1 is therefore sized to stay below the maximum rated power from power amplifier PA (for example, an output backed off 3 or 6 dB from the 1 dB compression point). By operating in this region, power amplifier PA will have a third order distortion component having a characteristic d3 (Po vs. Pi) as shown in FIG. 5. Specifically, the distortion in dB will go up 3 dB for each dB of increased power input; that is, the characteristic slope of distortion component d3 will be 3 to 1.

The third order distortion characteristic d3 does not maintain this 3 to 1 slope everywhere. In fact, characteristic d3 begins degrading for power output in the vicinity of the 1 dB compression point C. Therefore, running power amplifier PA backed off 3 or 6 dB has the benefit of producing third order distortion components that are rather well behaved, in the sense that the slope of the Po/Pi characteristic will remain fairly constant. Similar remarks apply for the other odd order distortion components.

The amplifier Z2 (FIG. 1) as explained hereinafter will be biased and driven to produce distortion. The bias and drive level will be set to keep the distortion of amplifier Z2 well behaved (3 to 1 characteristic) until reaching a drive level where the power amplifier PA becomes poorly behaved as well. To achieve this tracking of distortion the drive level and biasing of amplifier Z2 should be tentatively chosen and then the third order distortion components measured. The drive and biasing should be adjusted until amplifier Z2 exhibits a well behaved and poorly behaved region similar to power amplifier PA. Ideally, the power amplifier PA should have distortion characteristics that remain well behaved and poorly behaved in synchrony with amplifier Z2.

For this reason, the supply voltage and the power applied to amplifier Z2 ought to be carefully chosen. Thus the magnitude of attenuation by attenuator 42 should be chosen to allow the distortion of amplifier Z2 to track distortion in power amplifier PA. Establishing the environment of amplifier Z2 is part of the initial design phase, since this environment is not changed from unit to unit.

In contrast, parallel amplifier Z1 will tend to have comparatively little distortion, since amplifier Z1 is preceded by attenuator 44, which greatly reduces the drive level. Nevertheless, the output of amplifier Z1 closely follows the effective output produced by amplifier Z2 since that output is attenuated by attenuator 46.

With amplifier Z2 set to produce an appropriate distortion characteristic, the linearizer circuit of FIG. 1 can now be adjusted for optimizing the overall linear characteristics. To establish appropriate adjustments and alignment, the system is adjusted while connected to the power amplifier PA. A radio frequency signal is then applied to source terminal 10. In a preferred adjustment procedure, the signal on terminal 10 may be dual carriers, simulating the type of frequencies and bandwidth associated with cellular telephone communications or other PCS type systems. The amplitude of the signal at line 10 is set to drive power amplifier PA at its maximum rated level, that is, the 3 or 6 dB backoff point C of FIG. 5.

Figure 6A:
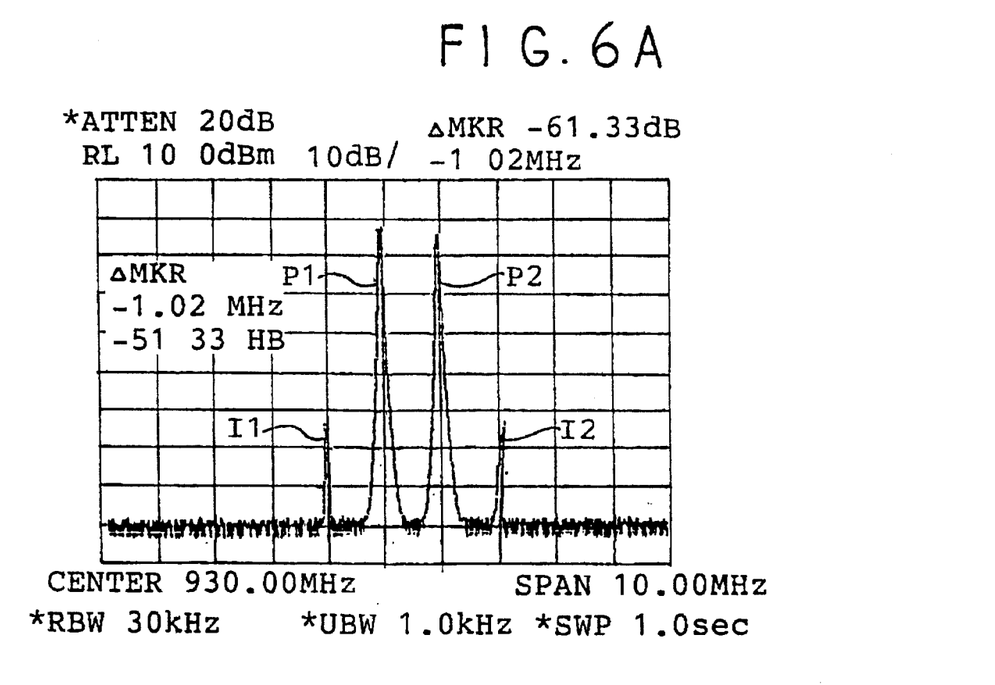
FIGS. 6A and 6B compare the output spectrum of a power amplifier with and without the linearizer of FIG. 1.

With a pair of carrier signals applied to source terminal 10, a spectrum analyzer can then be connected to the output of power amplifier PA. A conventional spectrum analyzer (not shown) may employ a swept frequency that produces a lower beat frequency that is detected by a narrow bandpass filter. Such spectrum analysis is displayed in FIGS. 6A and 6B. In FIG. 6A, dual carriers are shown with typical third order distortion. FIG. 6A shows the carrier peaks P1 and P2, which remain at the original frequencies. Intermodulation products I1 and I2 are shown on either side of the carriers P1 and P2, separated from them by an amount equal to the carrier to carrier frequency difference.

The plot of FIG. 6A corresponds to the amount of distortion to be expected without the linearizer of FIG. 1. The illustrated scale is 1 MHz per major division (abscissa is 10 MHz overall) and 10 dB per large division (peak value of ordinate is 10 dBm). Carrier P1 is set at 930 MHz and carrier P2 is 1 MHz higher. Before linearization, the power ration C/I between carrier P1 to intermodulation product I1 was measured at 51.33 dB.

During manufacture, the linearizer of FIG. 1 is connected with the power amplifier, and the power spectrum is analyzed as discussed above. Phase and amplitude of the compensating distortion are adjusted through devices 54 and 56. (Note amplifier Z1 and Z2, by design, need not be adjusted during manufacture). The adjustments of devices 54 and 56 are made by iteratively adjusting potentiometers R16 (FIG. 2) and potentiometer R24 (FIG. 3). For example, potentiometer R16 is adjusted in an attempt to minimize intermodulation products I1 and I2 (FIG. 6A). Once potentiometer R16 has been thus adjusted, then the amplitude adjustment is made through potentiometer R24, again adjusting to minimize intermodulation products I1 and I2 of FIG. 6A. The process is repeated with adjustments to potentiometers R16 and R24 being made iteratively until no further reduction in the intermodulation products I1 and I2 can be practically achieved.

Figure 6B:
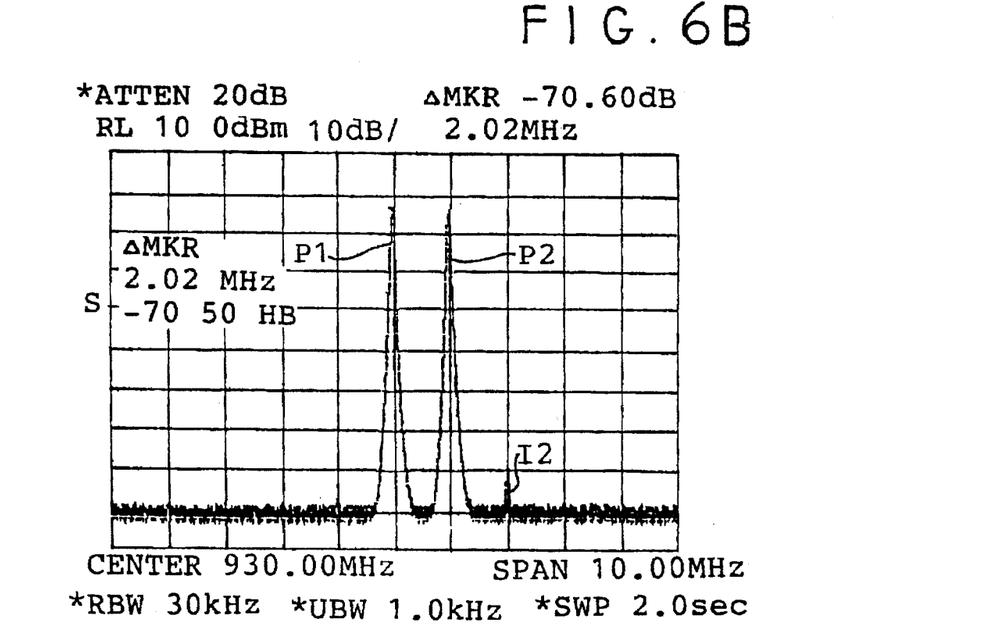

The result of the iterative adjustment is shown in FIG. 6B wherein the C/I ratio between carrier P2 and intermodulation product I2 was measured at 70.5 dB. This represents approximately a 20 dB improvement in the C/I ratio. The other previously observed intermodulation product (product I1 of FIG. 6A) is not visible in FIG. 6B, having been adjusted below the resolution capability of measuring equipment.

In operation in the field, the linearizer circuit of FIG. 1 applies to amplifiers Z1 and Z2 signals that are identical, except for having different magnitudes. Specifically, the radio frequency signal applied to amplifier Z1 is higher in amplitude since the input to amplifier to Z1 is reduced by attenuator 44. Consequently, both amplifiers Z1 and Z2 produce the undistorted first order components, but amplifier Z2 also produces the odd order distortion components. The output of amplifier Z2 is attenuated by attenuator 46 to produce an output having an amplitude about the same as amplifier Z1.

Significantly, the use of identical components for amplifiers Z1 and Z2 produce a high degree of tracking between these two amplifiers. Therefore, the variation in amplitude in phase will track closely notwithstanding variations in signal level and other ambient conditions.

The output of amplifier Z2 as reduced by attenuator 46 is inverted through delay line 48, which is one half wavelength long; thereby producing a 180° phase shift. Consequently, the output of delay line 48 as applied to Wilkinson combiner 50 has an inverted first order (linear) signal and inverted third order distortion components. The output of amplifier Z1 has essentially only an undistorted, first order (linear) signal applied to one input of Wilkinson combiner 50. Therefore, the first order (linear) component is cancelled, leaving only inverted distortion components. The effect would be equivalent to removing from FIG. 6A the first order carrier signals P1 and P2, leaving only the third order intermodulation products I1 and I2.

The isolated odd order distortion components are then optionally attenuated by attenuator 52, before being applied to phase and amplitude adjustment devices 54 and 56.

Because there are group delays associated with the transfer of the signals through amplifiers Z1 and Z2 and through phase and amplitude adjustment circuits 54 and 56, a matching group delay is produced by delay line 60. Therefore, the first order, undistorted signal arrives through delay line 60 at the Wilkinson combiner 58 with the same timing as the distorted signals passing through phase and amplitude adjustment circuits 54 and 56.

Wilkinson combiner 58 therefore receives an undistorted signal from delay line 60 and the corresponding distortion that would be expected to be produced by a power amplifier PA. However, the phase of the distortion signals from adjustment circuits 54 and 56 are inverted by virtue of the 180° delay line 48. Thus, the predistortion signal from Wilkinson combiner 58 will tend to compensate for the distortion produced by non-linearities in power amplifier PA.

In one constructed embodiment, the linearizer of FIG. 1 provides a 20 dB improvement in C/I at the 6 dB output power backoff point of a class A amplifier. In FIG. 5 the improved distortion is shown as curve $d'_3$, which as the same slope as uncompensated characteristic $d_3$, but reduced in magnitude. This performance is equivalent to that provided by a non-linearized device which is 10 dB more powerful. If no additional power was consumed, the "effective" efficiency would be greater as noted before.

This clearly illustrates the benefits accrued by the unique predistortion linearization disclosed herein. The combination of predistortion along with feedforward techniques, has yielded superior C/I performance at the 1 dB backoff point to that reported for other existing predistortion techniques. Another major advantage of this approach is that it provides independent adjustment of the magnitude and phase of the distortion products. This novel feature greatly simplifies tuning.

While the foregoing concerned linearizing a class A device, with a redesigned distortion generator, other classes can also be linearized.

It is to be appreciated that various modifications may be implemented with respect to the above described preferred embodiments. For example, certain cascaded devices can be connected in reverse order. Also, phase shifts and delays that are produced in certain branches of the linearizer can be distributed by having several discrete shifters or delays located at various locations or in different branches. The amplitude adjustments can also be performed at various stages and branches of the linearizer, differently than that illustrated. Also, while various active devices are illustrated, in some embodiments passive devices may be used where gain is not needed. Also, the gains or attenuations of various devices can be altered to produce a different overall gain. alternatively these parameters may be changed to offset one another and still produce the same overall gain or loss. Furthermore the rating and tolerance of the components can be altered, depending upon the intended power rating, frequency, accuracy, temperature stability, frequency stability, etc. Also depending upon the frequency, the circuit can be realized with wave guides or conventional wires or printed circuit traces.

Obviously, many modifications and variations of the present invention are possible in light of the above teachings. It is therefore to be understood that within the scope of the appended claims, the invention may be practiced otherwise than as specifically described.

I claim:

1. A linearizer for predistorting a radio frequency signal from a source before subsequent processing, comprising:

a dividing means adapted to be coupled to said source for dividing said radio frequency signal into a first, second and third part;

a first and a second transfer means coupled to said dividing means for receiving said first and said second part, respectively, of said radio frequency signal, said first and said second transfer means each having an output, said first transfer means having a conditioning device for conveying signals with distortion;

a third transfer means having an output and having an input coupled to said dividing means for separately receiving said third part of said radio frequency signal, said first transfer means having higher distortion than said second and third transfer means;

a combining means coupled to the outputs of said first, said second and said third transfer means for producing a predistortion signal corresponding to a combination of signals on the outputs of said first, said second and said third transfer means, said second transfer means having, with respect to undistorted output components reaching said combining means, a transfer characteristic whose output phase and amplitude substantially tracks that of said conditioning device during variations in amplitude; and a retarding means coupled with said combining means for retarding signals handled at said combining means to produce approximately a 180 degree phase shift between the outputs of said first and said second transfer means and to establish in said predistortion signal distorted components that are inverted with respect to undistorted components, when compared to the relationship between distorted and undistorted components produced by said conditioning device.

2. A linearizer according to claim 1 wherein said retarding means itself produces a 180 degree phase shift.

3. A linearizer according to claim 2 wherein said combining means comprises:

a first combination means having an output and having inputs coupled to the outputs of said first and said second transfer means for producing a distortion signal corresponding to a combination of signals on the outputs of said first and said second transfer means; and a second combination means coupled to the outputs of said first combination means and said third transfer means for producing the predistortion signal.

4. A linearizer according to claim 1 wherein said combining means comprises:

a first combination means having an output and having inputs coupled to the outputs of said first and said second transfer means for producing a distortion signal corresponding to a combination of signals on the outputs of said first and said second transfer means; and a second combination means coupled to the outputs of said first combination means and said third transfer means for producing the predistortion signal.

5. A linearizer according to claim 4 comprising:

an amplitude means coupled between said second combination means and the output of said first combination means for adjusting the amplitude applied to said second combination means.

6. A linearizer according to claim 5 wherein said amplitude means comprises:

a gain adjustable amplifier.

7. A linearizer according to claim 6 comprises:

a bias means for adjusting bias at said gain adjustable amplifier to adjust gain.

8. A linearizer according to claim 5 comprising:

a phase means coupled between said second combination means and the output of said first combination means for adjusting the phase applied to said second combination means.

9. A linearizer according to claim 4 comprising:

a phase means coupled between said second combination means and the output of said first combination means for adjusting the phase applied to said second combination means.

10. A linearizer according to claim 9 wherein said phase means comprises:

a coupler having an input port, an output port and a pair of device ports; and a pair of variable impedance devices separately connected to said device ports for providing an adjustable phase shift between said input and said output ports.

11. A linearizer according to claim 10 wherein said variable impedance devices comprise a pair of varactor diodes.

12. A linearizer according to claim 8 wherein the phase and amplitude of said predistortion signal are fixed to be non-adjustable except by said phase means and said amplitude means.

13. A linearizer according to claim 3 wherein said dividing means comprises:

a first divider means coupled to said source for dividing said radio frequency signal into the third part and an intermediate part; and a second divider means coupled to said first divider means for dividing said intermediate part into the first and the second part.

14. A linearizer according to claim 13 wherein said dividing means is fixed to be non-adjustable.

15. A linearizer according to claim 1 wherein said retarding means comprises:

a delay device serially connected with said conditioning means.

16. A linearizer according to claim 8 wherein said retarding means comprises:

a serpentine strip line.

17. A linearizer according to claim 8 wherein said third transfer means comprises:

a delay line.

18. A linearizer according to claim 3 wherein said third transfer means comprises:

a delay line providing a delay approximating the group delay from the source through the first transfer means to the combining means.

19. A linearizer according to claim 18 wherein said retarding means comprises:
a delay device.

20. A linearizer according to claim 18 wherein said delay line comprises a coaxial cable.

21. A linearizer according to claim 8 comprising:
a linear preamplifier coupled to said dividing means and having a gain set to provide a combined gain of unity from the radio frequency signal of the source to the predistortion signal of the combining means, so that said linearizer can be inserted without disturbing overall system gain.

22. A linearizer according to claim 3 wherein said first and said second combination means comprise a first and a second Wilkinson combiner, respectively.

23. A linearizer according to claim 1 wherein said conditioning means and said second transfer means are each operable to separately amplify said first and said second part of said radio frequency signal, said conditioning means having higher distortion than said second transfer means.

24. A linearizer according to claim 23 wherein said conditioning means comprises:
a first amplifier coupled to and driven by said dividing means; and
a first attenuator coupled to and driven by said first amplifier, said second transfer means comprising:
a second attenuator coupled to and driven by said dividing means; and
a second amplifier coupled to and driven by said first attenuator, said first and said second amplifier having about the same gain, said first and said second attenuator having about the same attenuation.

25. A linearizer for predistorting a radio frequency signal from a source before subsequent processing, comprising:
a dividing means adapted to be coupled to said source for dividing said radio frequency signal into a first, second and third part;
a first transfer means and a second transfer means each having an output and each being coupled to said dividing means for separately amplifying said first and said second part of said radio frequency signal, said first transfer means having higher distortion than said second transfer means;
a third transfer means having an output and having an input coupled to said dividing means for separately receiving said third part of said radio frequency signal, said first transfer means having higher distortion than said second transfer means; and
a combining means coupled to the outputs of said first, said second and said third transfer means for producing a predistortion signal corresponding to a combination of signals on the outputs of said first, said second and said third transfer means, said predistortion signal having distorted components that are inverted with respect to undistorted components, when compared to the relationship between distorted and undistorted components produced by said first transfer means.

26. A linearizer according to claim 25 wherein said first transfer means comprises:
a first amplifier coupled to and driven by said dividing means, said second transfer means comprising:
a second amplifier coupled to and driven by said dividing means.

27. A linearizer according to claim 26 wherein said first and said second amplifier have the same structure.

28. A linearizer according to claim 26 wherein said first transfer means comprises:
a first attenuator coupled to and driven by said first amplifier, said second transfer means comprising:
a second attenuator coupled to and driven by said dividing means for driving said second amplifier.

29. A linearizer according to claim 28 wherein said first and said second amplifier have about the same gain, said first and said second attenuator having about the same attenuation.

30. A linearizer according to claim 25 wherein said combining means comprises:
a first combination means having an output and having inputs coupled to the outputs of said first and said second transfer means for producing a distortion signal corresponding to a combination of signals on the outputs of said first and said second transfer means; and
a second combination means coupled to the outputs of said first combination means and said third transfer means for producing the predistortion signal.

31. A linearizer according to claim 30 comprising:
an amplitude means coupled between said second combination means and the output of said first combination means for adjusting the amplitude applied to said second combination means.

32. A linearizer according to claim 31 wherein said amplitude means comprises:
a gain adjustable amplifier.

33. A linearizer according to claim 31 comprising:
a phase means coupled between said second combination means and the output of said first combination means for adjusting the phase applied to said second combination means.

34. A linearizer according to claim 33 wherein the phase and amplitude of said predistortion signal are fixed to be non-adjustable except by said phase means and said amplitude means.

35. A linearizer according to claim 25 wherein said third transfer means comprises:
a delay line providing a delay approximating the group delay from the source through the first transfer means to the combining means.

36. A linearizer for predistorting a radio frequency signal from a source before subsequent processing, comprising:
a dividing means adapted to be coupled to said source for dividing said radio frequency signal into a first, second and third part;
a first and a second transfer means each having an output and each having an input coupled to said dividing means for separately receiving said first and said second part of said radio frequency signal;
a first Wilkinson combiner coupled to the outputs of said first and said second transfer means for producing a distortion signal corresponding to a combination of signals on the outputs of said first and said second transfer means;
a third transfer means having an output and having an input coupled to said dividing means for separately receiving said third part of said radio frequency signal; and
a second Wilkinson combiner coupled to said first Wilkinson combiner and the output of said third transfer means for combining the distortion signal with the signal on the output of said third transfer means to provide a predistortion signal and to establish in said predistortion signal distorted components that are inverted with respect to undistorted components, when compared to the relationship between distorted and undistorted components produced by said first and said second transfer means.

37. A linearizer according to claim 36 comprising:

an amplitude means coupled between said second Wilkinson combiner and the output of said first Wilkinson combiner for adjusting the amplitude applied to said second Wilkinson combiner.

38. A linearizer according to claim 37 wherein said amplitude means comprises:

a gain adjustable amplifier.

39. A linearizer according to claim 37 comprising:

a phase means coupled between said second Wilkinson combiner and the output of said first Wilkinson combiner adjusting the phase applied to said second Wilkinson combiner.

40. A linearizer according to claim 39 wherein the phase and amplitude of said predistortion signal are fixed to be non-adjustable except by said phase means and said amplitude means.

41. A linearizer according to claim 36 wherein said third transfer means comprises:

a delay line providing a delay approximating the group delay from the source through the first transfer means to the combining means.

42. A linearizer for predistorting a radio frequency signal from a source before subsequent processing, comprising:

a dividing means adapted to be coupled to said source for dividing said radio frequency signal into a first, second and third part;

a first and a second transfer means coupled to said dividing means for receiving said first and said second part, respectively, of said radio frequency signal, said first and said second transfer means each having an output, said first transfer means including:
(a) a conditioning device for conveying signals with distortion, and
(b) a retarding means serially coupled with said conditioning device for retarding signals handled at said conditioning device to produce approximately a 180 degree phase shift;

a third transfer means having an output and having an input coupled to said dividing means for separately receiving said third part of said radio frequency signal; and a combining means coupled to the outputs of said first, said second and said third transfer means for producing a predistortion signal corresponding to a combination of signals on the outputs of said first, said second and said third transfer means, said predistortion signal having distorted components that are inverted with respect to undistorted components, when compared to the relationship between distorted and undistorted components produced by said conditioning device.

43. A method for predistorting a radio frequency signal with a pair of devices before application to a power amplifier, comprising the steps of:

applying said radio frequency signal to said pair of devices with a first one of said devices operated to produce more distortion than the second one of the devices;

producing a distortion signal by combining the output of said pair of devices to substantially cancel the radio frequency signal except for distortion created by said first one of said devices;

producing a predistortion signal by recombining the distortion signal with a replica of the radio frequency signal and establishing in said predistortion signal distorted components that are inverted with respect to undistorted components, when compared to the relationship between distorted and undistorted components produced by said first one of said devices;

driving said power amplifier with said predistortion signal sized to bring the power amplifier to its rated power output; and adjusting the relative phase and relative amplitude between said distortion signal and the replica of the radio frequency signal in a direction to minimize the measured magnitude of third order distortion components produced by said power amplifier.

* * * * *